(12) United States Patent
Deck et al.

(10) Patent No.: US 7,521,916 B2
(45) Date of Patent: Apr. 21, 2009

(54) APPARATUS FOR THE DETECTION OF A CURRENT AND METHOD FOR OPERATING SUCH AN APPARATUS

(75) Inventors: Bernhard Deck, Weilheim (DE); Bruno Sabbattini, Zürich (CH); Richard Bloch, Nussbaumen (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 12/003,042

(22) Filed: Dec. 19, 2007

(65) Prior Publication Data

US 2008/0136403 A1 Jun. 12, 2008

Related U.S. Application Data

(63) Continuation of application No. PCT/CH2005/000357, filed on Jun. 29, 2005.

(51) Int. Cl.
 *G01R 1/10* (2006.01)
(52) U.S. Cl. .................................................... 324/110
(58) Field of Classification Search ................. None
 See application file for complete search history.

(56) References Cited

U.S. PATENT DOCUMENTS

| | | | | |
|---|---|---|---|---|
| 4,914,385 | A * | 4/1990 | Arinobu | 324/127 |
| 5,606,249 | A * | 2/1997 | Elms | 324/115 |
| 6,346,805 | B1 | 2/2002 | Ermisch et al. | |
| 6,617,838 | B1 * | 9/2003 | Miranda et al. | 324/117 R |
| 7,427,856 | B2 * | 9/2008 | Jones | 324/117 R |
| 2004/0245994 | A1 * | 12/2004 | Schlapp et al. | 324/500 |

FOREIGN PATENT DOCUMENTS

DE  34 25 390 A1  8/1986

(Continued)

OTHER PUBLICATIONS

J.M. Sohn et al., "Development of current and voltage sensor for distribution switchgear", 2003 IEEE PES Transmission and Distribution Conference, Conference Proceedings, Dallas, TX, Sep. 7-12, 2003, IEEE/PES Transmission and Distribution Conference and Exposition, New York, NY, IEEE, US, vol. 3 of 3, Sep. 7, 2003, pp. 827-830.

(Continued)

*Primary Examiner*—Jermele M Hollington
(74) *Attorney, Agent, or Firm*—Buchanan Ingersoll & Rooney PC

(57) ABSTRACT

An apparatus for the detection of a current in a protection and metering current range comprises one current sensor, which generates a voltage signal, and a voltage-limited electronic element. For metering voltage signals exceeding the upper metering voltage limit of the electronic element or for protection voltage signals exceeding the upper protection voltage limit of the electronic element an attenuation element with an attenuation factor being larger than unity is electrically connected to the current sensor. The attenuation factor is chosen in such a way that the metering voltage signal divided by the attenuation factor is smaller than or equal to the upper electronic element metering voltage limit or the protection voltage signal divided by the attenuation factor is smaller than or equal to the upper electronic element protection voltage limit.

38 Claims, 2 Drawing Sheets

FOREIGN PATENT DOCUMENTS

| | | |
|---|---|---|
| DE | 42 04 515 A1 | 8/1993 |
| DE | 42 24 190 A1 | 1/1994 |
| EP | 1 154 278 A2 | 11/2001 |
| GB | 2 063 488 A | 6/1981 |

OTHER PUBLICATIONS

PCT/ISA/210 Mar. 2006.
PCT/ISA/237 Mar. 2006.
PCT/IPEA/409 Oct. 2007.

* cited by examiner

APPARATUS FOR THE DETECTION OF A CURRENT AND METHOD FOR OPERATING SUCH AN APPARATUS

RELATED APPLICATION

This application claims priority as a continuation application under 35 U.S.C. §120 to PCT/CH2005/000357 filed as an International Application on 29 Jun. 2005 designating the U.S., the entire contents of which are hereby incorporated by reference in their entireties.

TECHNICAL FIELD

An apparatus for the detection of a protection current and a method for operating such an apparatus are disclosed.

BACKGROUND INFORMATION

U.S. Pat. No. 6,346,805 B1 describes an apparatus for current measurements in a wide range in which a first signal generated in a low-power measurement transformer with a magnetic core and a second signal generated in a nonmagnetic measurement transformer like a Rogowski coil are compared. Depending on the degree of accuracy, one of the two signals is then selected by comparing the signals from both measurement transformers and evaluating the deviation between the signals as a criterion for selecting a signal and then the selected signal is further processed. The low-power measurement transformer is used in the actual metering range and in large parts of the protective range, whereas the Rogowski coil is merely used in the protection range to detect high, stationary or displaced currents. A Zener diode is used as a protection element in order to limit the voltage generated in the Rogowski coil and to guarantee electromagnetic compability. The apparatus in U.S. Pat. No. 6,346,805 B1 needs two measurement transformers for the protection and metering range. As it has to be estimated for each signal which signal is selected according to the required accuracy, a fast signal processing system is needed. The apparatus can only be used in a predetermined metering range depending on the properties of the low-power measurement transformer and a predetermined protection range depending on the properties of the Rogowski coil and the upper limit of the A/D converter. It is not intended to use the apparatus in other metering and/or protection current ranges.

De 42 04 515 describes a method to measure metering and protection currents with a Rogowski coil. By a switch the signals are transmitted to an A/D converter either as amplified signals by a gain element or as unamplified signals. A calculation unit which is connected to the AD converter controls the switch and the gain element. The gain factor by which the signals are amplified is chosen by first applying the highest possible gain factor. In case the amplified and digitized signal exceeds the range of the A/D converter a lower gain factor is chosen until the digitized value is below the range of the AD converter. The lowest possible value is the unamplified signal from the Rogowski coil.

In IEEE PES transmission and distribution conference, p. 827-830 by Sohn J M et al. a system is described for measuring metering currents with a Rogowski coil. A resistor block is connected to the Rogowski coil in order to adjust the rated current range.

DE 34 25 390 describes a system for the measurement of a current with a magnetic core and a coil, which system can be operated in different measurement ranges by electrically connecting a different number of windings of the coil to an electronic device.

SUMMARY

An apparatus for the detection of a current in a protection current range with a current sensor which can be used as well in a metering current range and which current ranges are adjustable and a method for operating such an apparatus are disclosed.

An apparatus for the detection of a primary current in a protection current range with a current sensor is disclosed, the protection current range having an upper protection current limit, and the apparatus comprising a current sensor which generates a voltage signal, the same current sensor is suitable for measuring current in a metering current range with an upper metering current limit, wherein the apparatus further comprises a passive, analog attenuation element and a voltage-limited electronic element, which has an upper electronic element protection voltage limit and an upper electronic element metering voltage limit, the electronic element metering voltage limit being smaller than the upper electronic element protection voltage limit and which electronic element is suitable to measure a secondary protection voltage signal with measuring precision within a protection voltage range having an upper protection voltage limit, the protection voltage signal being generated from a primary protection current, and which is suitable to measure a metering voltage signal within a metering voltage range with an upper metering voltage limit, the metering voltage signal being generated from a metering current, and the metering voltage limit being smaller than the protection voltage limit, the same electronic element being suitable to measure a protection and metering voltage signal and wherein for a voltage signal in the protection voltage range, which signal exceeds the upper electronic element protection voltage limit, an electrical connection from the current sensor to the passive, analog attenuation element is present, the attenuation element attenuating the protection and metering voltage signals by an attenuation factor, the attenuation factor being larger than unity and the protection voltage signal divided by the attenuation factor being smaller than or equal to the upper electronic element protection voltage limit, or for a voltage signal in the metering voltage range, which signal exceeds the upper electronic element metering voltage limit, an electrical connection from the current sensor to the passive, analog attenuation element to the current sensor is present, the attenuation element attenuating the protection and metering voltage signals by an attenuation factor, the attenuation factor being larger than unity and the metering voltage signal divided by the attenuation factor being smaller than or equal to the upper electronic element metering voltage limit.

BRIEF DESCRIPTION OF THE DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
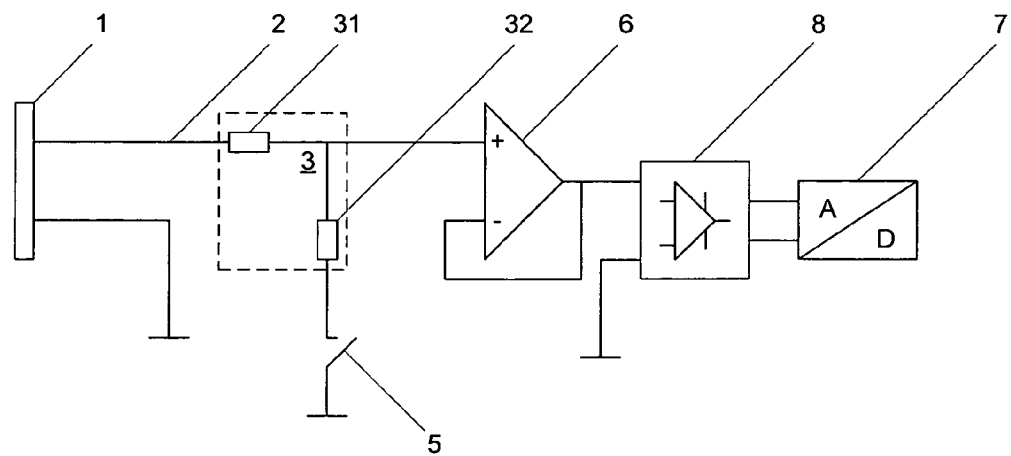
FIG. 1 shows a first exemplary embodiment of the apparatus according to the disclosure.

An apparatus for the detection of a current in a protection current range according to the disclosure, the protection current range having an upper protection current limit, comprises a current sensor, which generates a voltage signal. The same current sensor is also used in a metering current range with an upper metering current limit. The apparatus further comprises a voltage-limited electronic element, which has an upper electronic element protection voltage limit and an upper electronic element metering voltage limit, the electronic element metering voltage limit being smaller than the upper electronic element protection voltage limit. The electronic element is suitable to measure a protection voltage signal with measuring precision within a protection voltage range having an upper protection voltage limit, the protection voltage signal being generated from an over current. The electronic element is further suitable to measure a metering voltage signal within a metering voltage range with an upper metering voltage limit, the metering voltage signal being generated from a metering current, and the metering voltage limit being smaller than the protection voltage limit.

For a voltage signal in the protection voltage range, which signal exceeds the upper electronic element protection voltage limit, a passive, analog attenuation element is electrically connected to the current sensor, the attenuation element attenuating the protection and metering voltage signals by an attenuation factor, the attenuation factor being larger than unity and the protection voltage signal divided by the attenuation factor being smaller than or equal to the upper electronic element protection voltage limit and/or for a voltage signal in the metering voltage range, which signal exceeds the upper electronic element metering voltage limit, a passive, analog attenuation element is electrically connected to the current sensor, the attenuation element attenuating the protection and metering voltage signals by an attenuation factor, the attenuation factor being larger than unity and the metering voltage signal divided by the attenuation factor being smaller than or equal to the upper electronic element metering voltage limit. Such an apparatus is intended for use in different metering and/or protection current ranges without the need to use other sensors or components in the apparatus to adjust the sensitivity of the sensors to the processing device. Only one current sensor is needed for both metering and protection current ranges avoiding the utilization of different sensors and the need to perform calculations in order to decide from which current sensor the signal is processed. That way the reliability of the apparatus is increased. Furthermore, the signals can be adjusted in order to meet the metering and/or protection voltage ranges of the electronic element so that currents can be measured in a wide range.

In an exemplary embodiment the current sensor is constructed in the manner of an air-filled magnetic voltage sensor, which is suitable to detect a current by converting a change of the primary current into a voltage signal, in particular a Rogowski coil, which has a large linear dynamic range. In another exemplary embodiment the current sensor is an optical current sensor, which has a large linear dynamic range and converts a primary current into a voltage signal. Such an optical current sensor is described in DE 4 224 190 A1 and EP 1 154 278 A2. In another exemplary embodiment the attenuation element is an arrangement comprising at least two ohmic resistors. In such an arrangement the resistors can be disposed in series. The at least two ohmic resistors are cheap and it is easy to provide an attenuation element according to the desired attenuation factor.

In another exemplary embodiment the electronic element comprises an analog/digital converter and an integrator and/or the same electronic element is used to measure a protection and metering voltage signal.

In another exemplary embodiment the passive, analog attenuation element is electrically connected to the current sensor in the case that the upper protection voltage limit exceeds the upper electronic element protection voltage limit. The protection voltage limit divided by the attenuation factor is smaller than or equal to the upper electronic element protection voltage limit. In this case the apparatus is pre-adjusted for a maximum protection current to be detected before the measurements are performed. Such an apparatus is usable for manifold measuring tasks because the protection current range can easily be set in the apparatus without the need to change a sensor or an A/D converter.

In another exemplary embodiment the passive, analog attenuation element is electrically connected to the current sensor in the case that the upper metering voltage limit exceeds the upper electronic element metering voltage limit. The metering voltage limit divided by the attenuation factor is smaller than or equal to the upper electronic element metering voltage limit. In this case the apparatus is pre-adjusted for a maximum metering current to be detected before the measurements are performed. Such an apparatus is usable for manifold measuring tasks because the metering current range can easily be set in the apparatus without the need to change a sensor or an A/D converter.

In another exemplary embodiment the attenuation factor of the attenuation element is a power-of-two number greater than unity, i.e. $2^n$, n being a natural number. Such an attenuation factor is advantageous because after the digitization in the A/D converter resulting in a binary number the actual signal value can easily and quickly be reconstructed by changing the corresponding binary digit.

In another exemplary embodiment the apparatus comprises an electrical connection element, especially an integrated analog switch, by which connection element the attenuation element can be electrically connected to the current sensor. By using such a switch the protection and/or metering current range can easily and quickly be adjusted.

In another exemplary embodiment the connection element is electrically connected manually. This is advantageous if the upper limit of the protection current and/or metering current is given and the apparatus is pre-adjusted.

In another exemplary embodiment the connection element is electrically connected steered by a control signal. This is advantageous if the upper limit of the protection current and/or metering current is not known or changes during the measurements, so that the attenuation of the voltage signal is adjusted during the measurements.

In another exemplary embodiment the apparatus comprises a gain element, especially an integrated switchable resistor network and an amplifier, by which gain element a voltage signal can be amplified by at least one gain factor, the at least one gain factor being larger than unity and the protection voltage signal multiplied with the gain factor being smaller than or equal to the upper electronic element protection voltage limit and/or a metering voltage signal multiplied with the gain factor being smaller than or equal to the upper electronic element metering voltage limit. By such an amplification the voltage signals can optimally be adapted to the protection and/or metering voltage range of the electronic element so that the resolution of the signals is increased.

In another exemplary embodiment the upper protection voltage limit multiplied with the gain factor is smaller than or equal to the upper electronic element protection voltage limit and/or the upper metering voltage limit multiplied with the gain factor is smaller than or equal to the upper electronic element metering voltage limit. This is advantageous in order to optimally use the electronic element protection and/or metering voltage range and to increase the protection and/or metering voltage resolution if the upper limit of the protection current and/or metering current is given.

In another exemplary embodiment the attenuation factor is a power-of-two number, i.e. $2^n$, n being a natural number and the at least one gain factor is a power-of-two number larger than unity, a maximum gain factor being smaller than or equal to $2^{n-1}$. Such a combination of an attenuation factor and a gain factor being power-of-two numbers is advantageous because after the digitization in the A/D converter resulting in a binary number the actual signal value can easily and quickly be reconstructed by changing the corresponding binary digit for the attenuation and the amplification.

In another exemplary embodiment the apparatus comprises phase correction means, especially in form of at least one capacitor which correct for a phase shift of the voltage signal due to the attenuation element. If the apparatus comprises at least one gain element a phase correction means can also be provided for the correction of a phase shift due to the at least one gain element.

In another exemplary embodiment the apparatus comprises an overvoltage protection element, especially a gas arrester in order to protect the apparatus against overvoltages.

In a method for operating an apparatus for the detection of a current in a protection current range with an upper protection current limit according to the design of the apparatus and a metering current range with an upper metering current limit according to the disclosure the following steps are performed:

- a current is detected by an air-filled magnetic voltage sensor and converted into a voltage signal,
- the voltage signal is measured by a voltage-limited electronic element.

The upper protection current limit generates an upper protection voltage limit in the current sensor and the upper metering current limit generates an upper metering voltage limit in the current sensor. Before a current is detected the following steps are performed:

- a first ratio of the upper protection voltage limit divided by an upper electronic element protection voltage limit is determined, and/or
- a second ratio of the upper metering voltage limit divided by an upper electronic element metering voltage limit is determined,
- and, in the case that the first and/or second ratio exceeds unity, then the current sensor is electrically connected to an attenuation element, the attenuation element having an attenuation factor, the attenuation factor being larger than or equal to said first and/or second ratio,
- and in that case the protection and metering voltage signals are divided by the attenuation factor.

This method is advantageous because protection and metering currents can be detected with the same current sensor avoiding the utilization of different sensors and the need to perform calculations in order to decide from which current sensor the signal is processed. That way the reliability of the method is increased and calculation processes due to comparison of signals from different sensors can be avoided. Depending on the measuring task the reciprocal value of the attenuation factor can be chosen to be larger than or equal to one of the first and second ratios or to both of the first and second ratios.

In another exemplary embodiment in the case that the current sensor remains disconnected from the attenuation element, the unattenuated protection and metering voltage signals are multiplied by a gain factor being larger than unity, if the unattenuated protection voltage signals are smaller than or equal to the upper electronic element protection voltage limit divided by the gain factor, which is larger than unity. By such amplification the protection voltage signals can optimally be adapted to the protection voltage range of the electronic element so that the resolution of the signals is increased.

In the case that the attenuation element is electrically connected to the current sensor, the attenuated protection and metering voltage signals are multiplied by a gain factor being larger than unity, if the attenuated protection voltage signal is smaller than or equal to the upper electronic element protection voltage limit divided by said gain factor. By such amplification the protection voltage signals can optimally be adapted to the protection voltage range of the electronic element so that the resolution of the signals is increased.

In another exemplary embodiment in the case that the current sensor remains disconnected from the attenuation element, the unattenuated protection and metering voltage signals are multiplied by a gain factor, which is larger than unity, if the unattenuated metering voltage signals are smaller than or equal to the upper electronic element metering voltage limit divided by the gain factor. By such amplification the metering voltage signals can optimally be adapted to the metering voltage range of the electronic element so that the resolution of the signals is increased.

In the case that the attenuation element is electrically connected to the current sensor, the attenuated protection and metering voltage signals are multiplied by a gain factor being larger than unity, if the attenuated metering voltage signal is smaller than or equal to the upper electronic element metering voltage limit divided by said gain factor. By such amplification the metering voltage signals can optimally be adapted to the metering voltage range of the electronic element so that the resolution of the signals is increased.

FIG. 1 shows an apparatus for the detection of a current in accordance to the disclosure. The apparatus comprises a current sensor 1 being constructed in the manner of an air-filled magnetic voltage sensor, especially as a Rogowski coil, which is electrically connected to a single end operational amplifier by a conductor 2. Between the Rogowski coil and the operational amplifier 6 there is a passive, analog attenuation element 3 comprising at least two resistor elements 31 and 32, the element 31 being a serial resistor and the element 32 being electrically connectable via an electrical connection element 5, especially an integrated analog switch. The output of the operational amplifier 6 is electrically connected to a gain element 8, especially an integrated switchable resistor network and an amplifier, which is again connected to a voltage-limited electronic element 7. The electronic element 7 comprises an analog/digital converter (A/D converter) and an electronic integrator.

In the apparatus shown in FIG. 1 a change of a primary current is converted in the Rogowski coil into a voltage signal. The primary current can either be a metering current in a metering range having an upper metering current limit or a protection current in a protection current range having an upper protection current limit, the upper metering current limit being smaller than the upper protection current limit. Currents in the metering current range are converted into secondary voltage signals in a metering voltage range, the upper metering current limit being converted into an upper metering voltage limit. Currents in the protection current range are converted into secondary voltage signals with measuring precision in a protection voltage range, the upper protection current limit being converted into an upper protection voltage limit. The voltage-limited electronic element 7 has an electronic element protection voltage range with an upper electronic element protection voltage limit and an electronic element metering voltage range with an upper electronic element metering voltage limit, the electronic element metering voltage limit being smaller than the upper electronic element protection voltage limit.

In a first exemplary embodiment of the disclosure the attenuation element 3 is electrically connected to the Rogowski coil for a voltage signal in the protection voltage range, which signal exceeds the upper electronic element protection voltage limit. The attenuation element 3 attenuates subsequent protection as well as metering voltage signals by an attenuation factor. The attenuation factor is chosen in such a way that it is larger than unity and the protection voltage signal divided by the attenuation factor is smaller than or equal to the upper electronic element protection voltage limit.

In another exemplary embodiment of the disclosure the attenuation element 3 is electrically connected to the Rogowski coil for a voltage signal in the metering voltage range, which signal exceeds the upper electronic element metering voltage limit. The attenuation element 3 attenuates subsequent secondary protection as well as metering voltage signals by an attenuation factor. The attenuation factor is chosen in such a way that it is larger than unity and the metering voltage signal divided by the attenuation factor is smaller than or equal to the upper electronic element metering voltage limit.

In a further exemplary embodiment of the disclosure the voltage signals are attenuated by such an attenuation factor that metering voltage signals as well as protection voltage signals divided by the attenuation factor are smaller than or equal to the upper electronic element metering voltage limit or the upper electronic element protection voltage limit, respectively.

In a further exemplary embodiment of the disclosure, in the case that the upper protection voltage limit exceeds the upper electronic element protection voltage limit, the attenuation element 3 is electrically connected to the Rogowski coil manually and the protection voltage limit divided by the attenuation factor being smaller than or equal to the upper electronic element protection voltage limit.

In a further exemplary embodiment of the disclosure, in the case that the upper metering voltage limit exceeds the upper electronic element metering voltage limit, the attenuation element 3 is electrically connected to the Rogowski coil manually and the metering voltage limit divided by the attenuation factor is smaller than or equal to the upper electronic element metering voltage limit.

In a further exemplary embodiment, in the case that the upper protection voltage limit exceeds the upper electronic element protection voltage limit and the upper metering voltage limit exceeds the upper electronic element metering voltage limit, the attenuation element 3 is electrically connected to the Rogowski coil manually. The protection voltage limit divided by the attenuation factor is smaller than or equal to the upper electronic element protection voltage limit as well as the metering voltage limit divided by the attenuation factor is smaller than or equal to the upper electronic element metering voltage limit.

The method for determining whether the upper protection voltage limit exceeds the upper electronic element protection voltage limit and/or the upper metering voltage limit exceeds the upper electronic element metering voltage limit comprises the following steps:

a first ratio of the upper protection voltage limit divided by an upper electronic element protection voltage limit is determined, and/or a second ratio of the upper metering voltage limit divided by an upper electronic element metering voltage limit is determined, and, in the case that the first and/or second ratio exceeds unity, then the air-filled magnetic voltage sensor is electrically connected to an attenuation element 3 by an electrical connection element 5, the attenuation element 3 having an attenuation factor being larger than or equal to said first and/or second ratio, which exceeds unity, and in that case the protection and metering voltage signals are attenuated by the attenuation factor.

Figure 2:
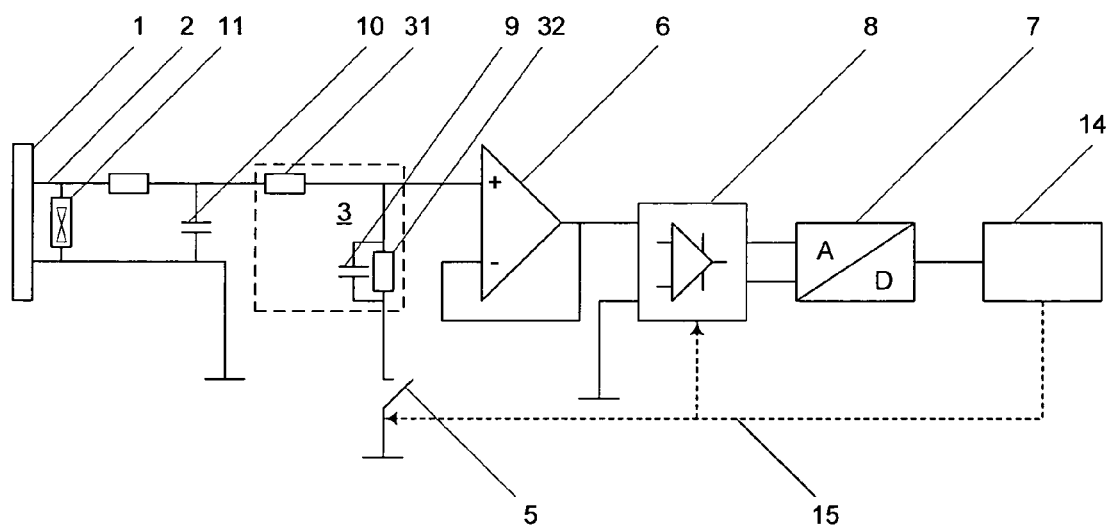
FIG. 2 shows another exemplary embodiment of the apparatus according to the disclosure.

In a further exemplary embodiment, the connection element is steered by a control signal, the control signal being generated according to the design of the apparatus or according to information from preceding voltage signals. As shown in FIG. 2 this information is sent as a control signal from a processing unit 14, which is electrically connected to the output of the A/D converter, back to the attenuation element 3 on a conductor 15 shown as a dashed line in FIG. 2. The control signal can take into account the course of the voltage signal in order to electrically connect the attenuation element 3 to the Rogowski coil in time before the voltage signal rises beyond the upper metering voltage limit or the upper protection voltage limit respectively.

If the signals are attenuated by an attenuation factor, information about the attenuation factor can be sent from the attenuation element 3 to the processing unit 14 in order to multiply the digital signal with the attenuation factor.

In a further exemplary embodiment of the inventive apparatus as shown in FIG. 1 the apparatus comprises a gain element 8, especially an integrated switchable resistor network and an amplifier, by which gain element 8 a voltage signal can be amplified by at least one gain factor. The at least one gain factor is larger than unity and the gain factor is chosen according to one of the features below or a combination thereof:

a protection voltage signal multiplied with the gain factor being smaller than or equal to the upper electronic element protection voltage limit, or a metering voltage signal multiplied with the gain factor being smaller than or equal to the upper electronic element metering voltage limit.

In a further exemplary embodiment the gain factor is chosen according to one of the features below or a combination thereof:

the upper protection voltage limit multiplied with the gain factor is smaller than or equal to the upper electronic element protection voltage limit, or the upper metering voltage limit multiplied with the gain factor is smaller than or equal to the upper electronic element metering voltage limit.

If the signals are amplified by a gain factor information about the gain factor can be sent from the gain element 8 to the processing unit 14 in order to multiply the digital signal with the reciprocal value of the gain factor.

In a further exemplary embodiment the attenuation factor is a power-of-two number larger than unity, i.e. $2^n$, and the at least one gain factor is a power-of two number larger than unity, a maximum gain factor being smaller than or equal to $2^{n-1}$, n being a natural number. The electronic element can comprise means for the correction of differences in the attenuation factor and/or the at least one gain factor from these power-of-two numbers.

In the following table examples are listed for attenuation factors and gain factors being power-of-two numbers. The Rogowski coil used for the determination of the attenuation factor and the maximum possible gain factor converts a current of 80 A at 50 Hz into a voltage signal of 150 mV without any attenuation or amplification of the voltage signal. The values in the table have been determined for an electronic element with an upper electronic element protection voltage limit of 7.5 V. For the metering range values are stated for a rated current or voltage, respectively, the rated values being 75% of the corresponding upper metering current or voltage limit. 75% is an exemplary value, but other values are also possible. The electronic element has an electronic element metering voltage range with a rated voltage of 150 mV, the upper electronic element metering voltage limit being 200 mV. The attenuation and gain factors have been determined in dependence of the upper protection current limit and the upper metering current limit. The attenuation element 3 has an attenuation factor of $2^4=16$ and the maximum gain factor, therefore, is $2^3=8$.

000 A. The voltage signals are attenuated by an attenuation factor of $2^4=16$ and a maximum gain factor of $2^2=4$ is possible.

Apparatus VII is intended for use for rated metering currents up to 640 A. For this apparatus the voltage signals are attenuated by an attenuation factor of $2^4=16$ and the maximum gain factor is 2.

For apparatus VIII with a rated metering current up to 1280 A and an upper protection current limit of 64 000 A the voltage signals are attenuated by an attenuation factor of $2^4=16$ with no gain.

As shown in FIG. 2 a control signal can be sent from the processing unit 14 over a conductor 15 shown as a dashed line back to the gain element 8. The control signal can take into account the course of the voltage signal in order to adjust the gain element 8 in time before the voltage signal rises beyond the upper metering voltage limit or the upper protection voltage limit respectively or falls below a lower voltage limit, for which a higher gain factor can be applied.

|  | Apparatus No. | | | | | | | |
| --- | --- | --- | --- | --- | --- | --- | --- | --- |
|  | I | II | III | IV | V | VI | VII | VIII |
| rated metering current in A | 10 | 20 | 40 | 80 | 160 | 320 | 640 | 1280 |
| upper metering current limit in A | 13 | 27 | 53 | 107 | 213 | 427 | 853 | 1707 |
| upper protection current limit in A | 500 | 1000 | 2000 | 4000 | 8000 | 16000 | 32000 | 64000 |
| rated metering voltage in V | 0.019 | 0.038 | 0.075 | 0.150 | 0.300 | 0.600 | 1.200 | 2.400 |
| upper metering voltage limit in V | 0.025 | 0.050 | 0.100 | 0.200 | 0.400 | 0.800 | 1.600 | 3.200 |
| upper protection voltage limit in V | 0.9 | 1.9 | 3.8 | 7.5 | 15.0 | 30.0 | 60.0 | 120.0 |
| attenuation factor | no | no | no | no | $2^4$ | $2^4$ | $2^4$ | $2^4$ |
| maximum gain factor | $2^3$ | $2^2$ | 2 | no | $2^3$ | $2^2$ | 2 | no |

Apparatus I is an apparatus intended for rated metering currents up to 10 A and an upper protection current limit of 500 A. For this apparatus no attenuation element 3 is connected to the Rogowski coil and the maximum gain factor is $2^3=8$.

Apparatus II is an apparatus intended for rated metering currents up to 20 A and an upper protection current limit of 1000 A. For this apparatus no attenuation element 3 is connected to the Rogowski coil and the maximum gain factor is $2^2=4$.

Apparatus III is an apparatus intended for rated metering currents up to 40 A and an upper protection current limit of 2000 A. For this apparatus no attenuation element 3 is connected to the Rogowski coil and the maximum gain factor is 2.

Apparatus IV is an apparatus intended for rated metering currents up to 80 A and an upper protection current limit of 4000 A. For this apparatus no attenuation element 3 is connected to the Rogowski coil and no gain is applied.

Apparatus V is intended for use for rated metering currents up to 160 A and an upper protection current limit of 8000 A. The voltage signals are attenuated by an attenuation factor of $2^4=16$ and a maximum gain factor of $2^3=8$ is possible.

Apparatus VI is intended for use for rated metering currents up to 320 A and an upper protection current limit of 16

The electronic element can comprise means for the correction of differences in the attenuation factor and/or the at least one gain factor from these power-of-two numbers.

In a further exemplary embodiment shown in FIG. 2 a phase correction means 9 is electrically connected to the Rogowski coil. In a exemplary embodiment the phase correction means 9 comprises at least one capacitor. The phase correction means 9 corrects for phase shifts due to the attenuation element 3. If the apparatus comprises a gain element 8 phase correction means 9, which correct for a phase shift in the gain element 8, can also be provided.

In a further exemplary embodiment shown in FIG. 2 the apparatus comprises an overvoltage protection element 11 to guarantee electromagnetic compatibility (EMC protection) by which voltages signals are limited to a maximum value. In a exemplary embodiment the overvoltage protection element 11 is a gas arrester.

The apparatus can further comprise a low-frequency filter 10 (EMC filter) with capacitive and/or inductive circuits.

Figure 3:
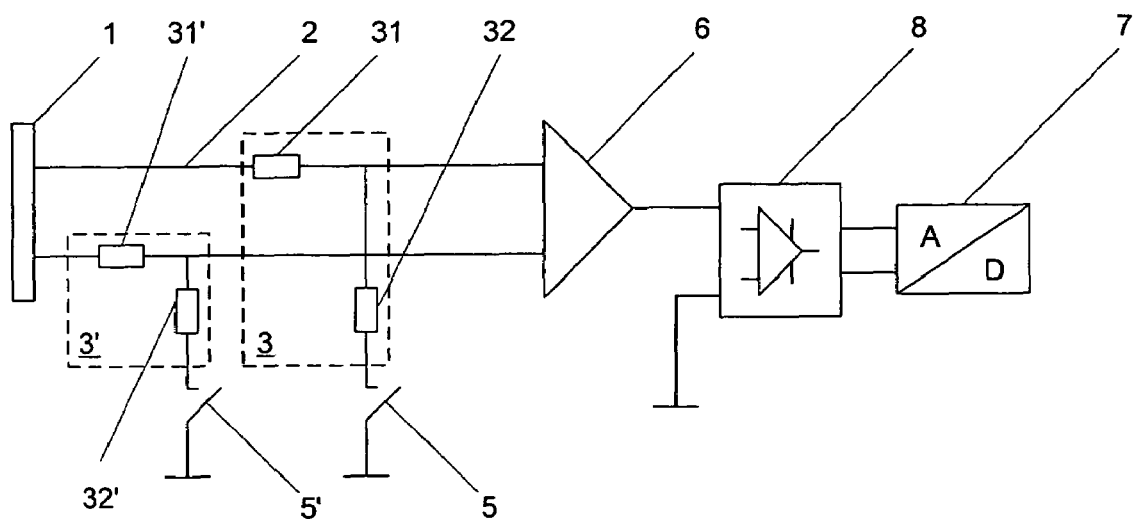
FIG. 3 shows yet another exemplary embodiment of the apparatus according to the disclosure.

Alternatively to the operational amplifier 6 as shown in FIG. 1, in a further exemplary embodiment of the disclosure, the current sensor 1, i.e. the Rogowski coil or the optical current sensor, is connected to a differential amplifier 61 by conductors 2 and 2', as shown in FIG. 3. In the case of a differential amplifier 61 connected to the Rogowski coil by conductors 2 and 2', there can be an attenuation element 3 and 3' between the Rogowski coil and the differential amplifier 61 on each conductor 2, 2'. The attenuation element 3' comprises at least two resistor elements 31' and 32', the element 31' being a serial resistor and the element 32' being electrically connectable via an electrical connection element 5', especially an integrated analog switch. Alternatively, there is only one attenuation element 3 on one of the conductors 2. A differential amplifier 61 is advantageous, if the Rogowski coil is single-point grounded and if the ground of the Rogowski coil and the amplifier differ. The voltage drop due to the difference in the grounds can lead to a signal distortion. The influence of this distortion can be avoided by using a differential amplifier 61. In a further exemplary embodiment, phase correction means 9 are provided for the correction of phase shifts due to each of the attenuation element 3 and 3'.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF DESIGNATIONS 1 current sensor
2, 2' conductor
3, 3' attenuation element
31, 31' serial resistor
32, 32' resistor
5, 5' electrical connection element
6 operational amplifier
61 differential amplifier
7 voltage-limited electronic element
8 gain element
9 phase correction means
10 low-frequency filter
11 overvoltage protection element
12 EMC element
14 processing unit
15 conductor for control signal

What is claimed is:

1. Apparatus for the detection of a primary current in a protection current range with a current sensor, the protection current range having an upper protection current limit, and the apparatus comprising a current sensor which generates a voltage signal, the same current sensor is suitable for measuring current in a metering current range with an upper metering current limit, wherein the apparatus further comprises a passive, analog attenuation element and a voltage-limited electronic element, which has an upper electronic element protection voltage limit and an upper electronic element metering voltage limit, the electronic element metering voltage limit being smaller than the upper electronic element protection voltage limit and which electronic element is suitable to measure a secondary protection voltage signal with measuring precision within a protection voltage range having an upper protection voltage limit, the protection voltage signal being generated from a primary protection current, and which is suitable to measure a metering voltage signal within a metering voltage range with an upper metering voltage limit, the metering voltage signal being generated from a metering current, and the metering voltage limit being smaller than the protection voltage limit, the same electronic element being suitable to measure a protection and metering voltage signal and wherein for a voltage signal in the protection voltage range, which signal exceeds the upper electronic element protection voltage limit, an electrical connection from the current sensor to the passive, analog attenuation element is present, the attenuation element attenuating the protection and metering voltage signals by an attenuation factor, the attenuation factor being larger than unity and the protection voltage signal divided by the attenuation factor being smaller than or equal to the upper electronic element protection voltage limit, or for a voltage signal in the metering voltage range, which signal exceeds the upper electronic element metering voltage limit, an electrical connection from the current sensor to the passive, analog attenuation element to the current sensor is present, the attenuation element attenuating the protection and metering voltage signals by an attenuation factor, the attenuation factor being larger than unity and the metering voltage signal divided by the attenuation factor being smaller than or equal to the upper electronic element metering voltage limit.

2. Apparatus according to claim 1, wherein for a voltage signal in the protection voltage range, which signal exceeds the upper electronic element protection voltage limit, an electrical connection from the current sensor to a passive, analog attenuation element is present, the attenuation element attenuating the protection and metering voltage signals by an attenuation factor, the attenuation factor being larger than unity and the protection voltage signal divided by the attenuation factor being smaller than or equal to the upper electronic element protection voltage limit, and for a voltage signal in the metering voltage range, which signal exceeds the upper electronic element metering voltage limit, an electrical connection from the current sensor to a passive, analog attenuation element to the current sensor is present, the attenuation element attenuating the protection and metering voltage signals by an attenuation factor, the attenuation factor being larger than unity and the metering voltage signal divided by the attenuation factor being smaller than or equal to the upper electronic element metering voltage limit.

3. Apparatus according to claim 2, wherein the current sensor is constructed in the manner of an air-filled magnetic voltage sensor, which is suitable to detect a current by converting a change of the current into a voltage signal.

4. Apparatus according to claim 2, wherein the apparatus comprises an overvoltage protection element especially a gas arrester.

5. Apparatus according to claim 1, wherein the current sensor is constructed in the manner of an air-filled magnetic voltage sensor, which is suitable to detect a current by converting a change of the current into a voltage signal.

6. Apparatus according to claim 5, wherein the attenuation element comprises at least two ohmic resistors.

7. Apparatus according to claim 5, wherein the electronic element comprises an analog/digital converter and an electronic integrator.

8. Apparatus according to claim 1, wherein the attenuation element comprises at least two ohmic resistors.

9. Apparatus according to claim 1, wherein the electronic element comprises an analog/digital converter and an electronic integrator.

10. Apparatus according to claim 9, wherein in the case that the upper protection voltage limit exceeds the upper electronic element protection voltage limit, the passive, analog attenuation element is electrically connected to the current sensor and the protection voltage limit divided by the attenuation factor being smaller than or equal to the upper electronic element protection voltage limit.

11. Apparatus according to claim 9, wherein the attenuation factor of the attenuation element is $2^n$, n being a natural number.

12. Apparatus according to claim 11, wherein the apparatus comprises a gain element, especially an integrated switchable resistor network and an amplifier, by which gain element a voltage signal can be amplified by at least one gain factor, the at least one gain factor being larger than unity and the protection voltage signal multiplied by the gain factor being smaller than or equal to the upper electronic element protection voltage limit and/or a metering voltage signal multiplied by the gain factor being smaller than or equal to the upper electronic element metering voltage limit.

13. Apparatus according to claim 1, wherein in the case that the upper protection voltage limit exceeds the upper electronic element protection voltage limit, the passive, analog attenuation element is electrically connected to the current sensor and the protection voltage limit divided by the attenuation factor being smaller than or equal to the upper electronic element protection voltage limit.

14. Apparatus according to claim 13, wherein in the case that the upper metering voltage limit exceeds the upper electronic element metering voltage limit, the passive, analog attenuation element is electrically connected to the current sensor and the metering voltage limit divided by the attenuation factor being smaller than or equal to the upper electronic element metering voltage limit.

15. Apparatus according to claim 1, wherein in the case that the upper metering voltage limit exceeds the upper electronic element metering voltage limit, the passive, analog attenuation element is electrically connected to the current sensor and the metering voltage limit divided by the attenuation factor being smaller than or equal to the upper electronic element metering voltage limit.

16. Apparatus according to claim 15, wherein the apparatus further comprises an electrical connection element, especially an integrated analog switch, by which connection element the attenuation element can be electrically connected to the current sensor.

17. Apparatus according to claim 1, wherein the apparatus further comprises an electrical connection element, especially an integrated analog switch, by which connection element the attenuation element can be electrically connected to the current sensor.

18. Apparatus according to claim 17, wherein the connection element is electrically connected either manually or steered by a control signal.

19. Apparatus according to claim 1, wherein the apparatus comprises a gain element, especially an integrated switchable resistor network and an amplifier, by which gain element a voltage signal can be amplified by at least one gain factor, the at least one gain factor being larger than unity and the protection voltage signal multiplied by the gain factor being smaller than or equal to the upper electronic element protection voltage limit and/or a metering voltage signal multiplied by the gain factor being smaller than or equal to the upper electronic element metering voltage limit.

20. Apparatus according to claim 19, wherein the upper protection voltage limit multiplied by the gain factor is smaller than or equal to the upper electronic element protection voltage limit and/or the upper metering voltage limit multiplied by the gain factor is smaller than or equal to the upper electronic element metering voltage limit.

21. Apparatus according to claim 19, wherein the attenuation factor of the attenuation element is $2^n$ and the at least one gain factor is a power-of two number, a maximum gain factor being smaller than or equal to $2^{n-1}$, n being a natural number.

22. Apparatus according to claim 19, wherein the apparatus comprises phase correction means, especially in form of at least one capacitor which correct for a phase shift of the voltage signal due to the attenuation element.

23. Apparatus according to claim 1, wherein the apparatus comprises phase correction means, especially in form of at least one capacitor which correct for a phase shift of the voltage signal due to the attenuation element.

24. Apparatus according to claim 1, wherein the apparatus comprises an overvoltage protection element especially a gas arrester.

25. Method for operating an apparatus according to claim 1 for the detection of a current in a protection current range with an upper protection current limit, the method comprising following steps:
   a current is detected by a current sensor, the current or a change of the current being converted into a voltage signal,
   the voltage signal is measured by a voltage-limited electronic element, a current is also detected in a current metering range with an upper metering current limit, wherein
      the current in the protection current range has an upper protection current limit according to the design of the apparatus, and the upper protection current limit generates an upper protection voltage limit in the air-filled magnetic voltage sensor,
      the upper metering current limit generates an upper metering voltage limit in the current sensor, and wherein before a current is detected the following steps are performed:
   a first ratio of the upper protection voltage limit divided by an upper electronic element protection voltage limit is determined, and/or
   a second ratio of the upper metering voltage limit divided by an upper electronic element metering voltage limit is determined,
   and, in the case that the first and/or second ratio exceeds unity, then the air-filled magnetic voltage sensor is electrically connected to an attenuation element, the attenuation element having an attenuation factor being larger than or equal to said first and/or second ratio,
   and in that case the protection and metering voltage signals are attenuated by the attenuation factor.

26. Method according to claim 25, wherein the first and second ratio is determined and the attenuation factor is larger than or equal to both of the first and second ratios.

27. Method according to claim 25, wherein if the attenuation element is electrically connected to the current sensor and the attenuated protection voltage signal is smaller than or equal to the upper electronic element protection voltage limit divided by said gain factor, then the attenuated protection and metering voltage signals are multiplied by said gain factor.

28. Method according to claim 27, wherein attenuation factor is $2^n$ and the maximum gain factor is $2^{n-1}$, n being a natural number.

29. Method according to claim 25, wherein if the attenuation element is electrically connected to the current sensor and the attenuated metering voltage signal generated by the upper metering current limit is smaller than or equal to the upper electronic element metering voltage limit divided by said gain factor, then the attenuated protection and metering voltage signals are multiplied by said gain factor.

30. Method according to claim 29, wherein attenuation factor is $2^n$ and the maximum gain factor is $2^{n-1}$, n being a natural number.

31. Method according to claim 25, wherein the attenuation factor is $2^n$, n being a natural number.

32. Method according to claim 31, wherein the connection element is connected manually.

33. Method according to claim 25, wherein the current sensor is electrically connected to an attenuation element by an electrical connection element.

34. Method according to claim 33, wherein the first and second ratio is determined and the attenuation factor is larger than or equal to both of the first and second ratios.

35. Method according to claim 33, wherein if the attenuation element is electrically connected to the current sensor and the attenuated protection voltage signal is smaller than or equal to the upper electronic element protection voltage limit divided by said gain factor, then the attenuated protection and metering voltage signals are multiplied by said gain factor.

36. Method according to claim 33, wherein if the attenuation element is electrically connected to the current sensor and the attenuated metering voltage signal generated by the upper metering current limit is smaller than or equal to the upper electronic element metering voltage limit divided by said gain factor, then the attenuated protection and metering voltage signals are multiplied by said gain factor.

37. Method according to claim 33, wherein the attenuation factor is $2^n$, n being a natural number.

38. Method for operating an apparatus for detection of a current in a protection current range with an upper protection current limit, the method comprising following steps:
  a current is detected by a current sensor, the current or a change of the current being converted into a voltage signal,
  the voltage signal is measured by a voltage-limited electronic element, a current is also detected in a current metering range with an upper metering current limit, wherein
    the current in the protection current range has an upper protection current limit according to the design of the apparatus, and the upper protection current limit generates an upper protection voltage limit in the air-filled magnetic voltage sensor,
    the upper metering current limit generates an upper metering voltage limit in the current sensor, and wherein
    before a current is detected the following steps are performed:
  a first ratio of the upper protection voltage limit divided by an upper electronic element protection voltage limit is determined, and/or
  a second ratio of the upper metering voltage limit divided by an upper electronic element metering voltage limit is determined,
  and, in the case that the first and/or second ratio exceeds unity, then the air-filled magnetic voltage sensor is electrically connected to an attenuation element, the attenuation element having an attenuation factor being larger than or equal to said first and/or second ratio,
  and in that case the protection and metering voltage signals are attenuated by the attenuation factor.

* * * * *